United States Patent
Korzenski et al.

(10) Patent No.: US 6,989,358 B2
(45) Date of Patent: Jan. 24, 2006

(54) SUPERCRITICAL CARBON DIOXIDE/ CHEMICAL FORMULATION FOR REMOVAL OF PHOTORESISTS

(75) Inventors: Michael B. Korzenski, Danbury, CT (US); Eliodor G. Ghenciu, King of Prussia, PA (US); Chongying Xu, New Milford, CT (US); Thomas H. Baum, New Fairfield, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 479 days.

(21) Appl. No.: 10/285,146

(22) Filed: Oct. 31, 2002

(65) Prior Publication Data

US 2004/0087457 A1 May 6, 2004

(51) Int. Cl.
*B08B 3/00* (2006.01)

(52) U.S. Cl. .................. 510/176; 510/175; 134/1.3; 134/2; 134/3

(58) Field of Classification Search .............. 510/175, 510/176, 177; 134/2, 3, 1.3, 902, 26, 36, 134/31; 438/745, 692; 430/329; 252/79.5, 252/79.4

See application file for complete search history.

(56) References Cited

U.S. PATENT DOCUMENTS

| | | | | |
|---|---|---|---|---|
| 5,866,005 A | * | 2/1999 | DeSimone et al. | 210/634 |
| 6,242,165 B1 | | 6/2001 | Vaartstra | |
| 6,306,564 B1 | * | 10/2001 | Mullee | 430/329 |
| 6,331,487 B2 | * | 12/2001 | Koch | 438/692 |
| 6,669,785 B2 | * | 12/2003 | DeYoung et al. | 134/3 |
| 6,764,552 B1 | * | 7/2004 | Joyce et al. | 134/3 |

* cited by examiner

*Primary Examiner*—Gregory Webb
(74) *Attorney, Agent, or Firm*—Steven J. Hultquist; Margaret Chappuis; Tristan A. Fuierer

(57) ABSTRACT

A photoresist cleaning composition for removing photoresist and ion implanted photoresist from semiconductor substrates. The cleaning composition contains supercritical $CO_2$ (SCCO2) and alcohol for use in removing photoresist that is not ion-implanted. When the photoresist has been subjected to ion implantation, the cleaning composition additionally contains a fluorine ion source. Such cleaning composition overcomes the intrinsic deficiency of SCCO2 as a cleaning reagent, viz., the non-polar character of SCCO2 and its associated inability to solubilize species such as inorganic salts and polar organic compounds that are present in the photoresist and that must be removed from the semiconductor substrate for efficient cleaning. The cleaning composition enables damage-free, residue-free cleaning of substrates having photoresist or ion implanted photoresist thereon.

37 Claims, 1 Drawing Sheet

SUPERCRITICAL CARBON DIOXIDE/ CHEMICAL FORMULATION FOR REMOVAL OF PHOTORESISTS

FIELD OF THE INVENTION

The present invention relates to supercritical carbon dioxide-based compositions useful in semiconductor manufacturing for the removal of photoresists, including photoresists per se and ion-implanted photoresists, from substrates having such photoresists thereon, and to methods of using such compositions for removal of photoresists and ion-implanted photoresists from semiconductor substrates.

DESCRIPTION OF THE RELATED ART

Semiconductor manufacturing involves the use of photoresists that are applied to wafer substrates and subsequently developed to produce specific patterned regions and structures on the wafer. This processing may include exposure of the photoresist to deep UV light and/or to high-dose ion implant, and the resulting photoresist materials and their residues are difficult to satisfactorily remove with conventional stripping and cleaning methods such as plasma etching and wet-bench cleaning. High-dose ion implant processing usually results in the formation of a tough, carbonized crust, which protects the underlying bulk photoresist from the cleaning process and reagents. Similar crusts are formed after reactive ion etching (RIE) of patterned photoresists, especially in microelectronic device structures with low-k dielectric films.

Conventional methods of cleaning require an oxygen-plasma ashing, often in combination with halogen gases, to penetrate the crust and remove the photoresist. Typically, the plasma ashing process requires a follow-up cleaning with wet chemicals and/or dilute acids to remove residues and non-volatile contaminants that remain after ashing. It is frequently necessary in such cleaning operations to repeat the ashing and wet cleaning steps in an alternating fashion for a number of successive treatment cycles in order to effect complete removal of all photoresist, crust and post-etch residues.

A number of problems and deficiencies of such ashing and wet cleaning operations have been encountered in their application, including:

(1) popping of the photoresist (leading to associated contamination of the semiconductor substrate) from the substrate surface, as the heated, residual solvent in the bulk photoresist vaporizes under the hardened crust;

(2) occurrence of residual metal contamination due to the presence of non-volatile metal compounds implanted into the photoresist that are not completely removed by the plasma ashing process;

(3) production of tough residues (of polymerized crust or highly cross-linked polymer) that remain on the semiconductor substrate despite the use of plasma ashing and wet chemical treatments; and (4) necessity of repetitive cleaning steps that increase photoresist stripping cycle times and work-in-process steps.

Subsequent to etching and optionally ashing of the exposed photoresist, residue remains on the substrate. This residue must be removed to ensure proper operation of the microelectronic device that is the ultimate product of the semiconductor manufacturing process, and to avoid interference or deficiency in relation to subsequent process steps in the manufacturing process.

Significant and continuing efforts have been made in the semiconductor manufacturing industry to develop improved formulations for removing photoresists and residues thereof from the semiconductor substrate. This effort has been frustrated by the continuing and rapid decrease in critical dimensions.

As critical dimensions of chip architectures become smaller, e.g., <100 nanometers, it becomes progressively more difficult to remove photoresists and residues from patterned semiconductor wafers with high aspect ratio trenches and vias. Conventional wet-cleaning methods suffer substantial limitations as critical dimension widths decrease below 100 nm due to the high surface tension characteristics of liquids used in the cleaning solution. Additionally, the use of aqueous cleaning solutions has the major deficiency that the aqueous solutions can strongly affect important material properties of porous low-k dielectric materials, including mechanical strength, moisture uptake, coefficient of thermal expansion, and adhesion to different substrates.

It would therefore be a significant advance in the art to provide a cleaning composition that overcomes such deficiencies of the prior and conventional cleaning compositions used for removal of photoresists and ion-implanted photoresists on semiconductor substrates.

SUMMARY OF THE INVENTION

The present invention relates to supercritical carbon dioxide-based compositions useful in semiconductor manufacturing for the removal of photoresists and ion-implanted photoresists from substrates including same, and methods of using such compositions for removal of photoresists and ion-implanted photoresists from semiconductor substrates.

In one aspect, the invention relates to a photoresist cleaning composition, comprising SCCO2 and alcohol.

In another aspect, the invention relates to a photoresist cleaning composition, comprising SCCO2 and alcohol, wherein the alcohol is selected from the group consisting of $C_1$–$C_4$ alcohols (e.g., methanol, ethanol, propanol and butanol), wherein the alcohol is present at a concentration of from about 5 to about 20 wt. %, based on the total weight of the cleaning composition, and wherein SCCO2 is present at a concentration of from about 80 to about 95 wt. %, based on the total weight of the cleaning composition.

A further aspect of the invention relates to a photoresist cleaning composition, comprising SCCO2, alcohol and a fluorine ion source, wherein the alcohol is selected from the group consisting of $C_1$–$C_4$ alcohols, wherein the fluorine ion source is present at a concentration of from about 0.01 to about 2 wt. %, based on the total weight of the composition, wherein the alcohol is present at a concentration of from about 5 to about 20 wt. %, based on the total weight of the cleaning composition, and wherein SCCO2 is present at a concentration of from about 79 to about 94.99 wt. %, based on the total weight of the cleaning composition.

A still further aspect of the invention relates to a method of removing photoresist from a substrate having same thereon, said method comprising contacting the photoresist with a cleaning composition comprising SCCO2 and alcohol, for sufficient time and under sufficient contacting conditions to remove the photoresist from the substrate.

Yet another aspect of the invention relates to a method of removing photoresist from a substrate having same thereon, said method comprising contacting the photoresist with a cleaning composition comprising SCCO2 and alcohol, to remove the photoresist from the substrate, wherein the alcohol is selected from the group consisting of $C_1$–$C_4$ alcohols, and the alcohol is present at a concentration of from about 5 to about 20 wt. %, based on the total weight of the composition, and said contacting is carried out under conditions including pressure in a range of from about 1000 to about 7500 psi, temperature in a range of from about 35° C. to about 100° C., for sufficient time to remove the photoresist from the substrate.

In another aspect, the invention relates to a method of removing ion implanted photoresist from a substrate having same thereon, said method comprising contacting the photoresist with a cleaning composition comprising SCCO2, alcohol and a fluorine ion source, for sufficient time and under sufficient contacting conditions to remove the ion implanted photoresist from the substrate.

A further aspect of the invention relates to a method of removing ion implanted photoresist from a substrate having same thereon, said method comprising contacting the ion implanted photoresist with a cleaning composition comprising SCCO2, alcohol and fluorine ion source, to remove the ion implanted photoresist from the substrate, wherein the alcohol is selected from the group consisting of $C_1$–$C_4$ alcohols, the alcohol is present at a concentration of from about 5 to about 20 wt. %, based on the total weight of the composition, said fluorine ion source is present at a concentration of from about 0.01 to about 2 wt. %, based on the total weight of the composition, and said contacting is carried out under conditions including pressure in a range of from about 1000 to about 7500 psi, temperature in a range of from about 35° C. to about 100° C., for sufficient time to remove the photoresist from the substrate.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
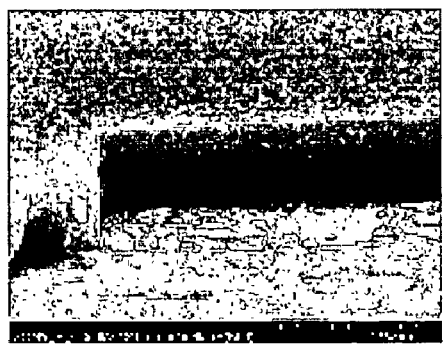
FIG. 1 is a scanning electron microscope (SEM) image at 50K magnification of a photoresist-bearing control wafer.

The present invention is based on the discovery of a supercritical carbon dioxide-based cleaning composition that is highly efficacious for the removal of photoresists, including photoresists per se as well as ion-implanted photoresists, from semiconductor substrates on which same are present.

Supercritical carbon dioxide (SCCO2) might at first glance be regarded as an attractive reagent for removal of photoresists, since supercritical $CO_2$ has the characteristics of both a liquid and a gas. Like a gas, it diffuses rapidly, has low viscosity, near-zero surface tension and penetrates easily into deep trenches and vias. Like a liquid, it has bulk flow capability as a "wash" medium.

Despite these ostensible advantages, however, supercritical $CO_2$ is non-polar. Accordingly, it will not solubilize many polar species, including inorganic salts and polar organic compounds that are present in the photoresists and that must be removed from the semiconductor substrate for efficient cleaning. The non-polar character of SCCO2 thus has been an impediment to the use of such reagent for photoresist removal subsequent to deposition of photoresist on the substrate.

Such deficiency of supercritical $CO_2$ has been overcome by the present invention in the provision of a SCCO2-based composition that is highly effective for cleaning of photoresists and ion-implanted photoresists, and achieves damage-free, residue-free cleaning of the substrate, e.g., a patterned wafer, initially having such photoresist thereon.

More specifically, the present invention provides a photoresist cleaning composition including SCCO2 and alcohol. The SCCO2 and alcohol form a co-solvent composition that is highly effective for photoresist removal.

In instances where the photoresist has been hardened by ion implantation, the present invention provides a cleaning composition including SCCO2, alcohol and a fluoride ion source compound, which is highly effective for the removal of the ion implant hardened photoresist.

The alcohol used in the SCCO2/alcohol cleaning compositions of the invention may be of any suitable type. In one embodiment of the invention, such alcohol comprises a $C_1$–$C_4$ alcohol (e.g., methanol, ethanol, isopropanol, or butanol), or a mixture of two or more of such alcohol species.

In a preferred embodiment, the alcohol is methanol, ethanol or isopropanol. The presence of the alcoholic co-solvent with the SCCO2 serves to increase the solubility of the composition for photoresist material, including inorganic salts and polar organic compounds present therein, in a manner providing a striking improvement in removal ability of the composition for photoresists, relative to SCCO2 alone.

In general, the specific proportions and amounts of SCCO2 and alcohol in relation to each other may be suitably varied to provide the desired solubilizing (solvating) action of the SCCO2/alcohol solution for the specific photoresist material, including inorganic salts and polar organic compounds therein, to be cleaned from the substrate. Such specific proportions and amounts are readily determinable by simple experiment within the skill of the art without undue effort.

In one embodiment, the SCCO2 and alcohol are formulated so that the resulting solution contains from about 5 to about 20 wt. % of alcohol.

The removal efficiency of the SCCO2 and alcohol composition may be enhanced by use of elevated temperature conditions in the contacting of the composition containing the photoresist to be removed.

Figure 2:
FIG. 2 is a scanning electron microscope (SEM) image at 50K magnification of a corresponding post-cleaned sample, which was cleaned of photoresist by contact of the photoresist-bearing substrate with a cleaning composition containing SCCO2/methanol, at 35° C. (the image exhibits a weak line pattern due to over-etch of the metal surface prior to SCCO2 cleaning).

By way of specific example, FIG. 1 is a scanning electron microscope (SEM) image at 50K magnification of a photoresist-bearing control wafer. FIG. 2 is a scanning electron microscope (SEM) image at 50K magnification of a corresponding post-cleaned sample, which was cleaned of photoresist by contact of the photoresist-bearing substrate with a cleaning composition of SCCO2/methanol, at 35° C.

As observed in FIG. 2, the photoresist was completely removed under these conditions.

Similar results in the complete removal of photoresist were achieved using a corresponding cleaning composition of SCCO2/methanol, at 70° C. A corresponding cleaning composition of SCCO2/isopropanol produced complete removal of the photoresist at 45° C. and 70° C., but only partial removal was effected with the composition of SCCO2/isopropanol at 35° C., indicating that solvating and removal capability of the SCCO2/alcohol composition can be enhanced by increasing the temperature of the contacting step in which the SCCO2/alcohol composition is contacted with the photoresist on the substrate to be cleaned.

The effect of specific temperature increases and temperature ranges, on the nature and extent of the removal of a specific photoresist in the practice of the invention, may be readily empirically determined, by varying the temperature to specific values and measuring the amount of photoresist material removed from the substrate by the SCCO2/alcohol composition at that temperature. In such manner, optimal temperature levels may be determined for a specific SCCO2/alcohol composition of the invention, for the specific photoresist material to be removed.

In like manner, the process conditions other than temperature may be selected and optimal or otherwise advantageous conditions determined within the skill of the art, including the superatmospheric pressure at which the supercritical fluid composition is contacted with the photoresist to be removed from the substrate, the flow and/or static character of the cleaning composition contacting, and the duration of the contacting.

The SCCO2/alcohol compositions of the invention may optionally be formulated with additional components to further enhance the removal capability of the composition, or to otherwise improve the character of the composition. Accordingly, the composition may be formulated with stabilizers, chelating agents, oxidation inhibitors, complexing agents, surfactants, etc.

In a specific embodiment, oxidation inhibitor may be incorporated in the SCCO2/alcohol compositions, such as for example boric acid, malonic acid, etc.

In one embodiment that is particularly suitable for complete removal of photoresist on patterned aluminum wafers, the cleaning composition comprises SCCO2 and alcohol, e.g., methanol, ethanol or isopropanol, wherein the alcohol is present in an amount of from about 5 to about 20 wt. %, based on the total weight of the composition (SCCO2 and alcohol). This composition has been demonstrated to successfully remove 100% of non-implanted photoresist on aluminum while completely maintaining the structural integrity of the underlying aluminum layer.

In such application of contacting the photoresist on the substrate with the cleaning composition comprising SCCO2 and alcohol, the cleaning composition is advantageously contacted with the photoresist at a temperature in a range of from about 35° C. to about 100° C., at a pressure in a range of from about 1000 to about 7500 psi, for a contacting duration in a range of from about 1 to about 30 minutes, to effectively dissolve and carry away photoresist without damaging the underlying aluminum structure.

When the photoresist on the substrate has been hardened by ion implantation, the ion implanted photoresist is advantageously removed from the substrate by a cleaning composition including SCCO2, alcohol and a fluoride ion source compound.

The SCCO2 and the alcohol may be formulated for such purpose as previously described in respect of cleaning compositions for non-ion implanted photoresists, with the additional fluoride ion source compound being added to the solution in an effective concentration, as readily determinable within the skill of the art, by the simple expedient of contacting the ion implant hardened photoresist with cleaning compositions of varying concentrations of the fluoride ion source compound, and determining the corresponding respective removal levels for the photoresist.

The fluoride ion source compound may be of any suitable type that is effective in the supercritical fluid composition under contacting conditions (with the ion implanted photoresist), to generate fluorine ions that enhance the removal capability of the cleaning composition, e.g., by reacting and complexing with the implanted cations such as boron, phosphorous and arsenic, to form SCCO2-soluble species that subsequently aid in the dissolution of the photoresist.

A particularly preferred fluorine ion source is ammonium fluoride, $NH_4F$, although any other suitable fluorine ion source material may be usefully employed. The fluoro species-enhanced SCCO2/alcohol composition may contain more than one fluorine ion source component. The fluorine source may be of any suitable type, e.g., a fluorine-containing compound or other fluoro species. Illustrative fluorine source components include hydrogen fluoride (HF), triethylamine trihydrogen fluoride or other amine trihydrogen fluoride compound of the formula $NR_3(HF)_3$ wherein each R is independently selected from hydrogen and lower alkyl ($C_1$–$C_8$ alkyl), hydrogen fluoride-pyridine (pyr-HF), ammonium fluorides of the formula $R_4NF$, wherein each R is independently selected from hydrogen and lower alkyl ($C_1$–$C_8$ alkyl), other quaternary fluorides, xenon difluoride, fluoromethane, etc. etc.

In one embodiment of the invention, wherein ammonium fluoride ($NH_4F$) is employed as the fluorine ion source component, such component is utilized at a concentration in a range of from about 0.01 wt. % to about 5 wt. %, and more preferably in a range of from about 0.1 wt. % to about 1 wt. %, based on the total weight of the cleaning composition (i.e., SCCO2, alcohol and fluorine ion source).

Figure 3:
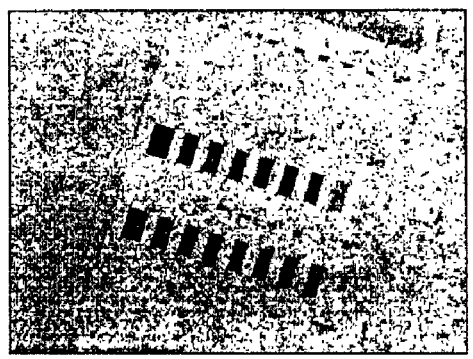
FIG. 3 is optical microscope image at 60K magnification of an ion-implanted photoresist-bearing control wafer.
Figure 4:
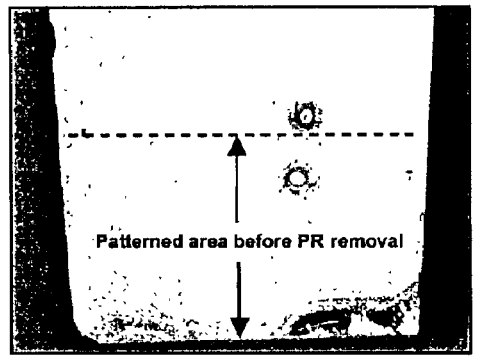
FIG. 4 is a corresponding scanning electron microscope (SEM) image of the ion-implanted photoresist-bearing control wafer of FIG. 3, after cleaning for 15 minutes with an SCCO2/methanol/$NH_4F$ solution at 55° C. and 4000 psi pressure.

By way of further specific example, FIG. 3 is an optical microscope image at 60K magnification of an ion-implanted photoresist-bearing control wafer. FIG. 4 is a corresponding scanning electron microscope (SEM) image of the ion-implanted photoresist-bearing control wafer of FIG. 3, after cleaning for 15 minutes with an SCCO2/methanol/$NH_4F$ solution at 55° C. and 4000 psi pressure. As observed in FIG. 4, the photoresist was completely removed under these conditions by the SCCO2/methanol/$NH_4F$ solution.

In a preferred composition of such character, as particularly adapted to cleaning of ion implanted photoresist from silicon and/or $SiO_2$ substrates, ammonium fluoride is present at a concentration of from about 0.1 to about 1.0 wt. %, alcohol is present at a concentration of from about 5 to about 20 wt. %, and SCCO2 is present at a concentration of from about 79 to about 94.9 wt. %, based on the total weight of the cleaning composition (SCCO2, alcohol and $NH_4F$).

Such cleaning composition may be contacted with the ion implanted photoresist under any suitable process conditions. In a particularly preferred embodiment, such cleaning composition is contacted with the ion implanted photoresist at a temperature in a range of from about 45° C. to about 75° C., at a pressure in a range of from about 2000 to about 4500 psi, for a contacting duration in a range of from about 5 to about 15 minutes, to effectively dissolve and carry away photoresist without damaging the underlying silicon/silicon dioxide structure. The contacting preferably is conducted in a dynamic contacting mode, involving continuous flow of the cleaning composition over the photoresist-bearing surface, to maximize the mass transfer gradient and effect complete removal of the photoresist from the substrate.

Cleaning processes of the invention may alternatively be carried out in a static soak mode, wherein the photoresist is contacted with a static volume of the cleaning composition and maintained in contact therewith for a continued (soaking) period of time, or as a still further alternative, the contacting of the cleaning composition with the photoresist may be carried out in sequential processing steps including dynamic flow of the cleaning composition over the substrate having the photoresist thereon, followed by a static soak of the substrate in the cleaning composition, with the respective dynamic flow and static soak steps being carried out alternatingly and repetitively, in a cycle of such successive steps.

The cleaning compositions of the present invention are readily formulated by simple mixing of ingredients, e.g., in a mixing vessel under gentle agitation.

Once formulated, such cleaning compositions are applied to the substrate for contacting with the residue thereon, at suitable elevated pressures, e.g., in a pressurized contacting chamber to which the cleaning composition is supplied at suitable volumetric rate and amount to effect the desired contacting operation for removal of the photoresist.

It will be appreciated that specific contacting conditions for the cleaning compositions of the invention are readily determinable within the skill of the art, based on the disclosure herein, and that the specific proportions of ingredients and concentrations of ingredients in the cleaning compositions of the invention may be widely varied while achieving desired removal of the photoresist from the substrate.

Accordingly, while the invention has been described herein in reference to specific aspects, features and illustrative embodiments of the invention, it will be appreciated that the utility of the invention is not thus limited, but rather extends to and encompasses numerous other aspects, features and embodiments. Accordingly, the claims hereafter set forth are intended to be correspondingly broadly construed, as including all such aspects, features and embodiments, within their spirit and scope.

What is claimed is:

1. A photoresist cleaning composition, comprising SCCO2, alcohol, a fluorine ion source, and an oxidation inhibitor, wherein the oxidation inhibitor comprises an acid selected from the group consisting of boric acid and malonic acid.

2. The composition of claim 1, wherein the alcohol comprises at least one $C_1$–$C_4$ alcohol.

3. The composition of claim 1, wherein the alcohol comprises ethanol.

4. The composition of claim 1, wherein the alcohol comprises methanol.

5. The composition of claim 1, wherein the alcohol comprises isopropanol.

6. The composition of claim 1, wherein the alcohol comprises butanol.

7. The composition of claim 1, wherein the concentration of alcohol is from about 5 wt. % to about 20 wt. %, based on the total weight of the composition.

8. The composition of claim 1, wherein said fluorine ion source includes at least one fluorine source reagent selected from the group consisting of hydrogen fluoride (HF), amine trihydrogen fluoride compounds of the formula $NR_3(HF)_3$ wherein each R is independently selected from hydrogen and lower alkyl, hydrogen fluoride-pyridine (pyr-HF), ammonium fluorides of the formula $R_4NF$, wherein each R is independently selected from hydrogen and lower alkyl, other quaternary fluorides, xenon difluoride, and fluoromethane.

9. The composition of claim 1, wherein the fluorine ion source has a concentration of from about 0.01 wt. % to about 5 wt. %, based on the total weight of the composition.

10. The composition of claim 1, wherein the fluorine ion source has a concentration of from about 0.1 wt. % to about 1 wt. %, based on the total weight of the composition.

11. The composition of claim 1, wherein the fluorine ion source includes a compound of the formula $NR_4F$ wherein each R is independently selected from hydrogen and lower alkyl.

12. The composition of claim 1, wherein the fluorine ion source includes ammonium fluoride.

13. A photoresist cleaning composition, comprising SCCO2, alcohol, a fluorine ion source, and an oxidation inhibitor, wherein the alcohol is selected from the group consisting of methanol, ethanol and isopropanol, wherein the alcohol is present at a concentration of from about 5 to about 20 wt. %, based on the total weight of the cleaning composition, and wherein SCCO2 is present at a concentration of from about 80 to about 95 wt. %, based on the total weight of the cleaning composition, and wherein the oxidation inhibitor comprises an acid selected from the group consisting of boric acid and malonic acid.

14. A photoresist cleaning composition, comprising SCCO2, alcohol, a fluorine ion source, and an oxidation inhibitor, wherein the alcohol is selected from the group consisting of methanol and isopropanol, wherein the fluorine ion source is present at a concentration of from about 0.1 to about 1 wt. %, based on the total weight of the composition, wherein the alcohol is present at a concentration of from about 5 to about 20 wt. %, based on the total weight of the cleaning composition, wherein SCCO2 is present at a concentration of from about 79 to about 94.9 wt. %, based on the total weight of the cleaning composition, and wherein the oxidation inhibitor comprises an acid selected from the group consisting of boric acid and malonic acid.

15. The composition of claim 14, wherein the fluorine ion source comprises $NH_4F$.

16. A method of removing photoresist from a substrate having same thereon, said method comprising contacting the photoresist with a cleaning composition comprising SCCO2, alcohol, a fluorine ion source, and an oxidation inhibitor for sufficient time and under sufficient contacting conditions to remove the photoresist from the substrate, wherein the oxidation inhibitor comprises an acid selected from the group consisting of boric acid and malonic acid.

17. The method of claim 16, said contacting conditions comprise elevated pressure.

18. The method of claim 17, wherein said elevated pressure comprises pressure in a range of from about 1000 to about 7500 psi.

19. The method of claim 16, wherein said contacting conditions comprise elevated temperatures.

20. The method of 19, wherein said elevated temperature comprises temperature in a range of from about 35° C. to about 100° C.

21. The method of claim 16, wherein said contacting time is in a range of from about 1 to about 30 minutes.

22. The method of claim 16, composition comprises methanol as said alcohol, present at a concentration of from about 5 to about 20 wt. %, based on the total weight of the cleaning composition.

23. A method of removing photoresist from a substrate having same thereon, said method comprising contacting the photoresist with a cleaning composition comprising SCCO2, alcohol, a fluorine ion source, and an oxidation inhibitor to remove the photoresist from the substrate, wherein said alcohol is selected from the group consisting of methanol, ethanol and isopropanol, and said alcohol is present at a concentration of from about 5 to about 20 wt. %, based on the total weight of the composition, wherein the oxidation inhibitor comprises an acid selected from the group consisting of boric acid and malonic acid, and said contacting is carried out under conditions including pressure in a range of from about 1000 to about 7500 psi, temperature in a range of from about 35° C. to about 100° C., for sufficient time to remove the photoresist from the substrate.

24. The method of claim 23, wherein the contacting time is in a range of from about 1 to about 30 minutes.

25. A method of removing ion implanted photoresist from a substrate having same thereon, said method comprising contacting the photoresist with a cleaning composition comprising SCCO2, alcohol, a fluorine ion source, and an oxidation inhibitor, for sufficient time and under sufficient contacting conditions to remove the ion implanted photoresist from the substrate, wherein the oxidation inhibitor comprises an acid selected from the group consisting of boric acid and malonic acid.

26. The method of claim 25, wherein said fluorine ion source includes at least one fluorine source reagent selected from the group consisting of hydrogen fluoride (HF), amine trihydrogen fluoride compounds of the formula $NR_3(HF)_3$ wherein each R is independently selected from hydrogen and lower alkyl, hydrogen fluoride-pyridine (pyr-HF), ammonium fluorides of the formula $R_4NF$, wherein each R is independently selected from hydrogen and lower alkyl, other quaternary fluorides, xenon difluoride, and fluoromethane.

27. The method of claim 25, wherein the fluorine ion source has a concentration of from about 0.1 wt. % to about 1 wt. %, based on the total weight of the composition.

28. The method of claim 25, wherein the fluorine ion source comprises $NH_4F$.

29. The method of the claim 25, wherein the alcohol is selected from the group consisting of methanol, ethanol and isopropanol, wherein tile fluorine ion source is present at a concentration of from about 0.1 to about 1 wt. %, based on the total weight of the composition, wherein the alcohol is present at a concentration of from about 5 to about 20 wt. %, based on the total weight of the cleaning composition, and wherein SCCO2 is present at a concentration of from about 79 to about 94.9 wt. %, based on the total weight of the cleaning composition.

30. The method of claim 29, wherein the fluorine ion source comprises $NH_4F$.

31. The method of claim 25, wherein said contacting conditions comprise elevated pressure.

32. The method of claim 31, wherein said elevated pressure comprises pressure in a range of from about 1000 to about 7500 psi.

33. The method of claim 25, wherein said contacting conditions comprise elevated temperature.

34. The method of claim 33, wherein said elevated temperature comprises temperature in a range of from about 45° C. to about 100° C.

35. The method of claim 25, wherein said contacting time is in a range of from about 1 to about 15 minutes.

36. A method of removing ion implanted photoresist from a substrate having same thereon, said method comprising contacting the ion implanted photoresist with a cleaning composition comprising SCCO2, alcohol, fluorine ion source, and an oxidation inhibitor, to remove the ion implanted photoresist from the substrate, wherein said alcohol is selected from the group consisting of methanol, ethanol and isopropanol, said alcohol is present at a concentration of from about 5 to about 20 wt. %, based on the total weight of the composition, said fluorine ion source is present at a concentration of from about 0.1 to about 1 wt. %, based on the total weight of the composition, said oxidation inhibitor comprises an acid selected from the groin, consisting of boric acid and malonic acid, and said contacting is carried out under conditions including pressure in a range of from about 2000 to about 4500 psi, temperature in a range of from about 45° C. to about 75° C., for sufficient time to remove the photoresist from the substrate.

37. The method of claim 36, wherein the contacting time is in a range of from about 5 to about 15 minutes.

* * * * *

UNITED STATES PATENT AND TRADEMARK OFFICE
CERTIFICATE OF CORRECTION

| | |
|---|---|
| PATENT NO. | : 6,989,358 B2 |
| APPLICATION NO. | : 10/285146 |
| DATED | : January 24, 2006 |
| INVENTOR(S) | : Michael B. Korzenski et al. |

It is certified that error appears in the above-identified patent and that said Letters Patent is hereby corrected as shown below:

Column 8, line 6, "quatemary" should be --quatenary--
Column 8, line 54, "16, said contacting" should be --16, wherein said contacting--
Column 8, line 60, "temperatures" should be --temperature--
Column 8, line 66, "16, composition comprises" should be --16, wherein said composition comprises--
Column 9, line 37, "quatemary" should be --quaternary--
Column 10, line 1, "tile" should be --the--
Column 10, line 37, "groin" should be --group--

Signed and Sealed this

Tenth Day of October, 2006

JON W. DUDAS
*Director of the United States Patent and Trademark Office*